(12) United States Patent
Warren et al.

(10) Patent No.: US 9,029,991 B2
(45) Date of Patent: May 12, 2015

(54) SEMICONDUCTOR PACKAGES WITH REDUCED SOLDER VOIDING

(75) Inventors: Robert W. Warren, Newport Beach, CA (US); Hyun Jung Lee, Aliso Viejo, CA (US); Nic Rossi, Causeway Bay (HK)

(73) Assignee: Conexant Systems, Inc., Irvine, CA (US)

(*) Notice: Subject to any disclaimer, the term of this patent is extended or adjusted under 35 U.S.C. 154(b) by 348 days.

(21) Appl. No.: 12/927,549

(22) Filed: Nov. 16, 2010

(65) Prior Publication Data

US 2012/0119341 A1    May 17, 2012

(51) Int. Cl.
*H01L 23/495* (2006.01)
*H01L 21/48* (2006.01)
*H01L 23/00* (2006.01)
*H01L 23/31* (2006.01)

(52) U.S. Cl.
CPC ...... *H01L 23/49503* (2013.01); *H01L 21/4828* (2013.01); *H01L 23/49548* (2013.01); *H01L 24/97* (2013.01); *H01L 23/3107* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2224/97* (2013.01); *H01L 2924/01029* (2013.01); *H01L 2924/01047* (2013.01); *H01L 2924/01079* (2013.01); *H01L 2924/01082* (2013.01); *H01L 2924/15311* (2013.01); *H01L 24/48* (2013.01); *H01L 2924/014* (2013.01); *H01L 2224/32013* (2013.01)

(58) Field of Classification Search
CPC ..................................................... H01L 23/495
USPC ................. 438/106–123, 612; 257/676–678, 257/E21.001, E23.031, E21.499, E23.034, 257/666, 670, 672
See application file for complete search history.

(56) References Cited

U.S. PATENT DOCUMENTS

| | | | | |
|---|---|---|---|---|
| 4,830,678 A * | 5/1989 | Todorof et al. | ............... | 136/259 |
| 4,866,506 A * | 9/1989 | Nambu et al. | ................. | 257/667 |
| 5,105,259 A * | 4/1992 | McShane et al. | ............. | 257/667 |
| 5,345,106 A * | 9/1994 | Doering et al. | ................ | 257/675 |
| 5,430,331 A * | 7/1995 | Hamzehdoost et al. | ...... | 257/796 |
| 5,442,234 A * | 8/1995 | Liang | ............................ | 257/675 |
| 5,530,295 A * | 6/1996 | Mehr | ............................ | 257/796 |
| 5,892,290 A * | 4/1999 | Chakravorty et al. | ........ | 257/786 |
| 5,903,052 A * | 5/1999 | Chen et al. | ..................... | 257/706 |
| 5,958,607 A | 9/1999 | Kim | | |
| 6,081,029 A * | 6/2000 | Yamaguchi | .................... | 257/718 |
| 6,167,948 B1 * | 1/2001 | Thomas | .................... | 165/104.26 |
| 6,188,130 B1 * | 2/2001 | Ramirez et al. | ............... | 257/706 |
| 6,204,553 B1 * | 3/2001 | Liu et al. | ........................ | 257/676 |
| 6,239,487 B1 * | 5/2001 | Park et al. | ...................... | 257/712 |
| 6,452,255 B1 * | 9/2002 | Bayan et al. | ................... | 257/666 |
| 6,465,876 B1 * | 10/2002 | Kitano et al. | .................. | 257/668 |
| 6,585,905 B1 * | 7/2003 | Fan et al. | ......................... | 216/14 |
| 6,638,790 B2 * | 10/2003 | Minamio et al. | .............. | 438/111 |
| 6,713,864 B1 * | 3/2004 | Huang | ........................... | 257/712 |

(Continued)

*Primary Examiner* — Mohammad Islam
*Assistant Examiner* — Ankush Singal
(74) *Attorney, Agent, or Firm* — Haynes and Boone, LLP

(57) ABSTRACT

An example semiconductor package with reduced solder voiding is described, which has a leadframe having an I/O pad and a thermal pad, a fabricated semiconductor die having a bond pad, where the fabricated semiconductor die is attached to a top surface of the thermal pad, and a wire bond connecting the bond pad to the I/O pad, where a bottom surface of the thermal pad has channels.

19 Claims, 18 Drawing Sheets

(56) References Cited

U.S. PATENT DOCUMENTS

| | | | |
|---|---|---|---|
| 6,777,788 B1* | 8/2004 | Wan et al. | 257/670 |
| 7,009,283 B1* | 3/2006 | de Simone et al. | 257/675 |
| 7,042,083 B2* | 5/2006 | Sugizaki et al. | 257/701 |
| 7,049,177 B1* | 5/2006 | Fan et al. | 438/123 |
| 7,087,461 B2* | 8/2006 | Park et al. | 438/112 |
| 7,169,651 B2* | 1/2007 | Park et al. | 438/124 |
| 7,315,077 B2* | 1/2008 | Choi et al. | 257/666 |
| 7,728,414 B2* | 6/2010 | Omori et al. | 257/676 |
| 7,772,036 B2* | 8/2010 | Bauer et al. | 438/112 |
| 7,781,885 B2* | 8/2010 | Lin et al. | 257/720 |
| 8,022,532 B2* | 9/2011 | Kasuya et al. | 257/707 |
| 2002/0105069 A1* | 8/2002 | Kawahara et al. | 257/690 |
| 2002/0146863 A1* | 10/2002 | Lin et al. | 438/119 |
| 2002/0180015 A1* | 12/2002 | Yamaguchi et al. | 257/678 |
| 2003/0006055 A1* | 1/2003 | Chien-Hung et al. | 174/52.1 |
| 2003/0127711 A1* | 7/2003 | Kawai et al. | 257/666 |
| 2004/0041222 A1* | 3/2004 | Loh | 257/433 |
| 2004/0056337 A1* | 3/2004 | Hasebe et al. | 257/667 |
| 2004/0166662 A1* | 8/2004 | Lei | 438/614 |
| 2004/0217450 A1* | 11/2004 | Li et al. | 257/666 |
| 2005/0006737 A1* | 1/2005 | Islam et al. | 257/676 |
| 2005/0037618 A1* | 2/2005 | Lee et al. | 438/689 |
| 2005/0051877 A1* | 3/2005 | Hsu | 257/667 |
| 2005/0230820 A1* | 10/2005 | Licht | 257/720 |
| 2005/0248022 A1* | 11/2005 | Badr et al. | 257/690 |
| 2005/0263864 A1* | 12/2005 | Islam et al. | 257/676 |
| 2006/0038266 A1* | 2/2006 | Song et al. | 257/676 |
| 2007/0259482 A1* | 11/2007 | Tsai et al. | 438/109 |
| 2008/0029856 A1* | 2/2008 | Chou et al. | 257/666 |
| 2008/0258278 A1* | 10/2008 | Ramos et al. | 257/676 |
| 2009/0008754 A1* | 1/2009 | Kawasaki et al. | 257/675 |
| 2009/0166826 A1* | 7/2009 | Janducayan et al. | 257/676 |
| 2009/0250807 A1* | 10/2009 | Lim et al. | 257/712 |
| 2010/0270665 A1* | 10/2010 | Lee et al. | 257/676 |
| 2012/0038036 A1* | 2/2012 | Chun et al. | 257/677 |

* cited by examiner

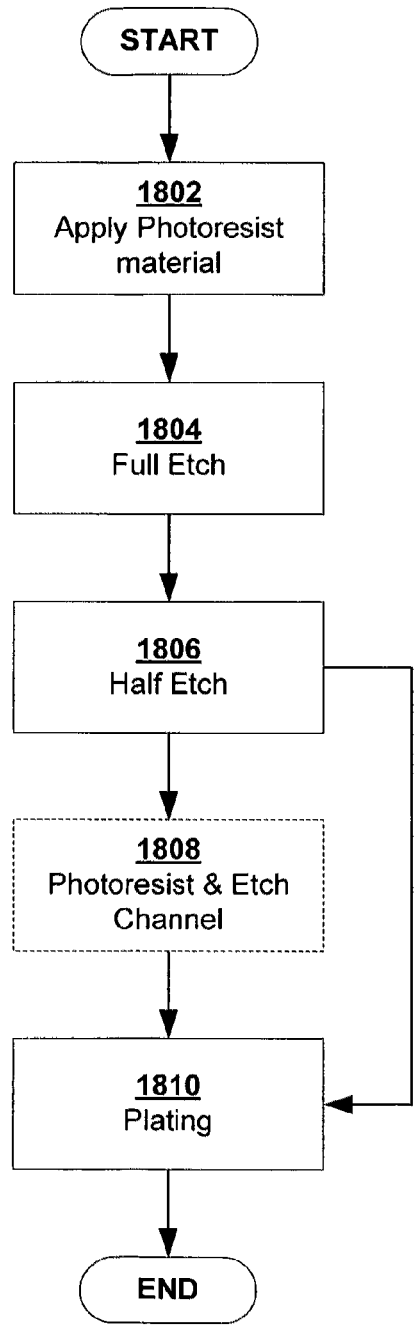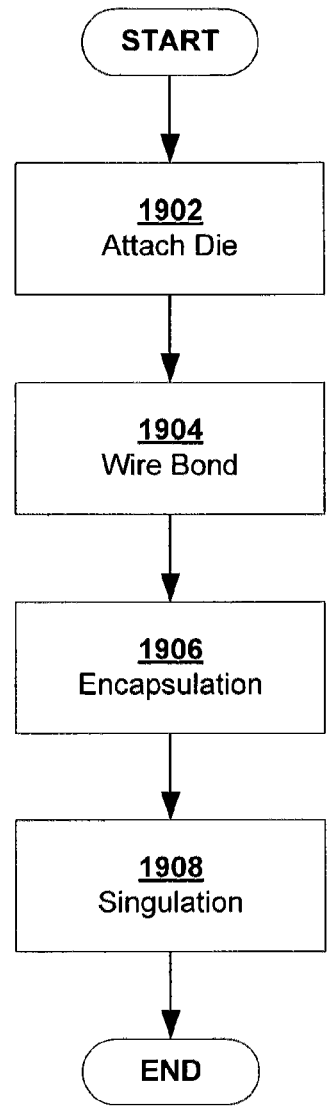
FIG. 18
FIG. 19

US 9,029,991 B2

SEMICONDUCTOR PACKAGES WITH REDUCED SOLDER VOIDING

TECHNICAL FIELD

This invention relates to semiconductor packages and specifically to improved design and methods for reducing solder voiding and splattering.

BACKGROUND ART

Flat no leads packages such as quad flat no leads (QFN) and dual flat no leads are connected to printed circuit boards (PCB) without the need of leads. A no leads package typically comprises several electrical I/O pads surrounding a thermal pad. They are mounted to a PCB with a pattern matching the pads of the package by applying solder paste to the pads of the package and affixing it to the PCB. Package is attached to the PCB by means of a reflow oven which melts the solder allowing the package pads to bond with electrical contacts on the PCB.

For thermal dissipation which is increasingly more important in today's integrated circuits. A central thermal pad is attached to a PCB. Improper soldering between the thermal pad and the PCB can yield hotspots which can cause the semiconductor die to overheat in places and possibly fail. Often best practices are given to the end customer as to how to best mount a no leads package to a PCB to prevent poor soldering, but are often ignored by the end customer.

SUMMARY OF INVENTION

There are provided semiconductor packages with reduced solder voiding and related methods of semiconductor packaging, substantially as shown in and/or described in connection with at least one of the figures, as set forth more completely in the claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 18 shows a flow chart of a manufacturing technique for a leadframe sheet, according to an embodiment of the present invention; and FIG. 19 shows a flow chart of a packaging technique, according to an embodiment of the present invention.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1:
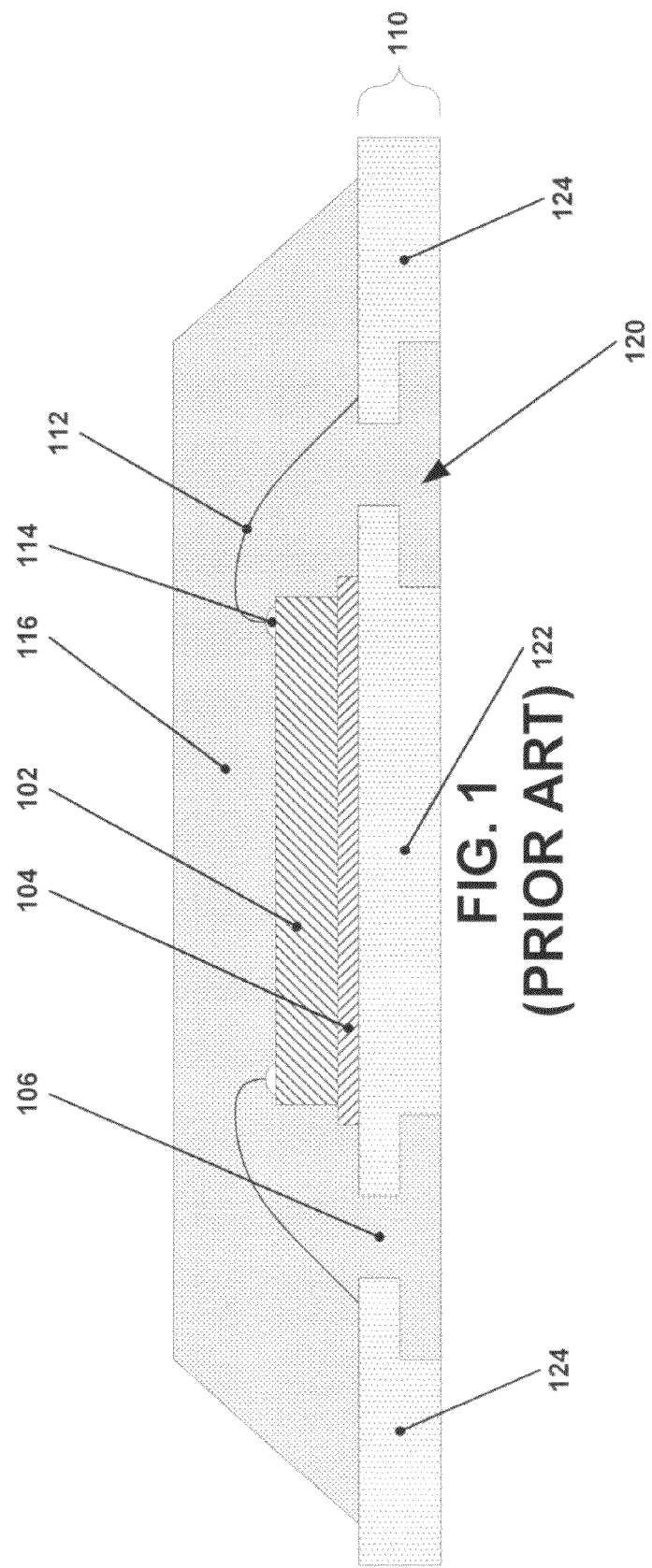
FIG. 1 shows a conventional flat no-leads package.

FIG. 1 shows an embodiment of a semiconductor package, such as a flat no-leads package. Package 100 comprises fabricated die 102 affixed to the top surface of leadframe 110 by die attach epoxy 104. Bond wires 112 connect bondpads 114 on fabricated die 102 to specific I/O pads 124 of leadframe 110. Package 100 including fabricated die 102, bond wires 112 and gaps (such as gap 120) in leadframe 110 may be encased in mold compound 116, such as by injection molding.

Leadframe 110 comprises thermal pad 122 and a number of I/O pads 124. I/O pads 124 are soldered to I/O lands on a printed circuit board (PCB) in order to communicate electrically with fabricated die 102. Thermal pad 122 is soldered to a thermal land on a PCB in order to conduct heat away from fabricated die 102. Thermal pad 122 is often coupled to the ground plane of a PCB.

The bottom surface of leadframe 110 is etched to give definition to thermal pad 122 and I/O pads 124. The etching is typically half the height of the leadframe and often referred to as half-etching. A typical leadframe may have the height of 6-8 mils so the bottom is typically etched by 50-70% of starting metal.

Figure 2:
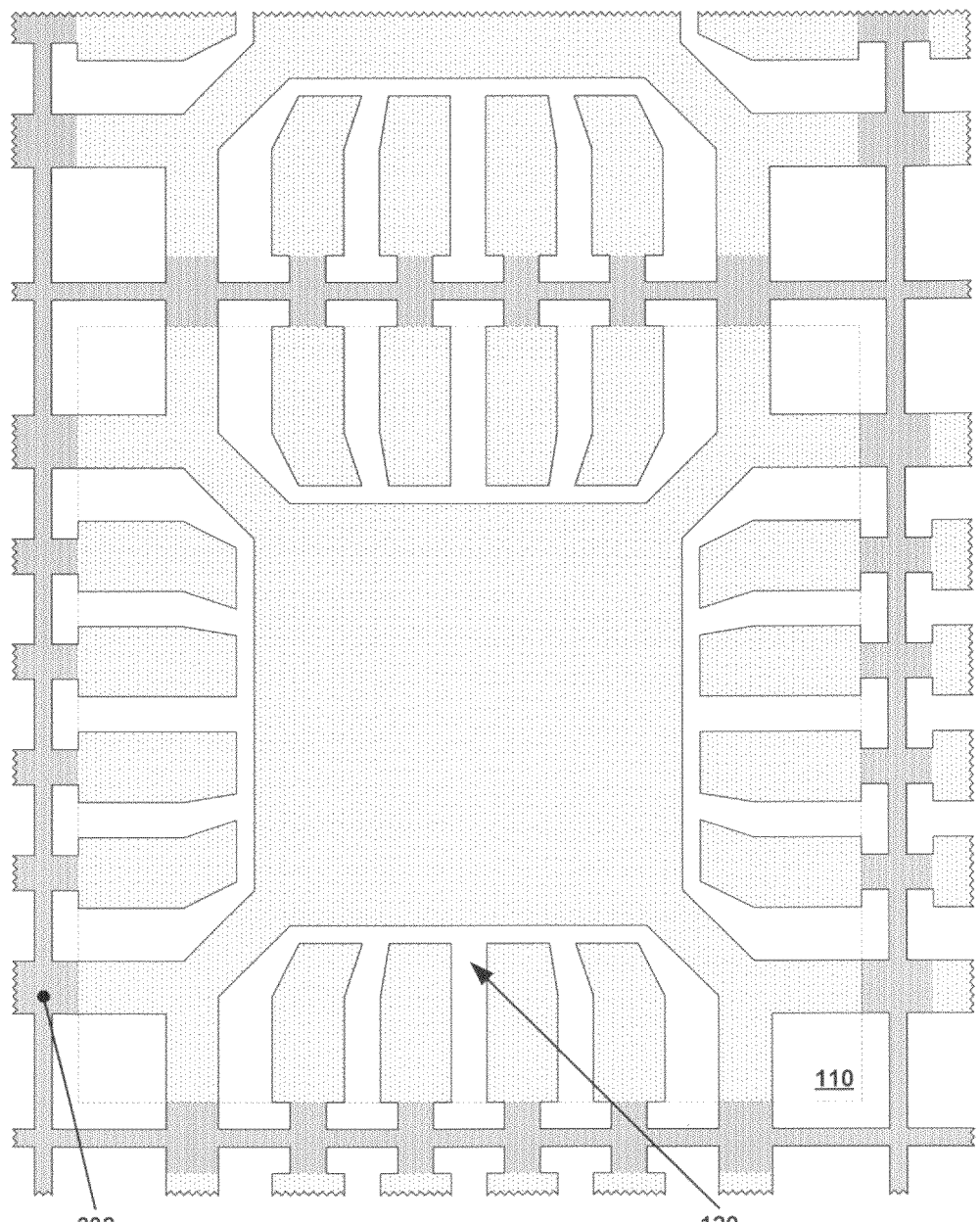
FIG. 2 shows a top view of a conventional QFN leadframe, before singulation while in a matrix strip.

FIG. 2 shows a top view of a QFN leadframe. Leadframe 110 is patterned with regions for the thermal pad and I/O pads. There are also gaps in the pattern, such as indicated by arrow 120, into which mold compound will be molded. A single leadframe is indicated by the dotted box. Typically, leadframes are delivered on a strip of metal, such as copper, so many leadframes are provided on a single sheet. The I/O pads and thermal pad and adjacent leadframes are held together by tie bars 202 which are indicated in the diagram by a darker shaded region. The tie bars are part of the same sheet of metal as the thermal pads and I/O pads, but are removed as part of the singulation process. Typically many dies are attached to their respective leadframes in an array. They are then wire bonded and encapsulated in mold compound. Leading to an array of packages. These packages are separated by singulation. Two basic types of singulation include punch singulation where a punch "punches out" each package and saw singulation where each package is separated by sawing. In any case, the tie bars are removed as part of this singulation process.

Figure 3:
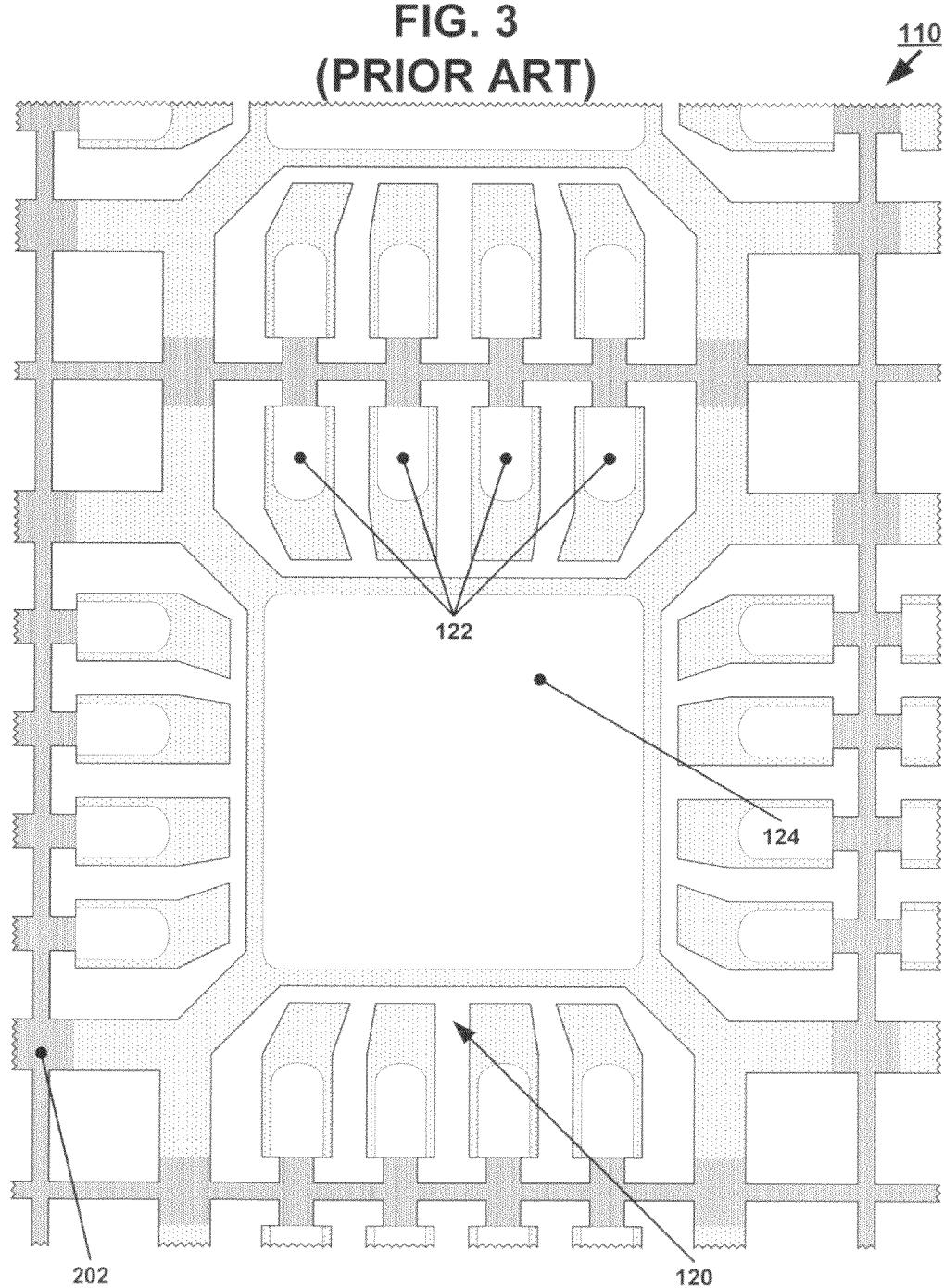
FIG. 3 shows a bottom view of a conventional QFN leadframe.

FIG. 3 shows a bottom view of a corresponding QFN leadframe. The leadframe sheet is half etched from the bottom. During the half etch process, the tie bars are half etched. Furthermore thermal pad 124 and I/O pads 122 are typically also half etched around the perimeter of each pad to give better definition to the respective pads. Though shown in the diagram by different highlighting I/O pads 122 and thermal pad 124 are part of same metal as leadframe 110 and in fact is the metal left after the half etch.

A flat no-leads package is affixed to a PCB by applying a solder paste to the pattern metal lands on the PCB. The package is then placed upon the solder paste. When all packages are placed on a PCB, the device is placed in a reflow oven, which heats the device until the solder melts and bonds the metal pads to the metal lands. The large thermal pad can pose some problems when soldering.

Figure 4:
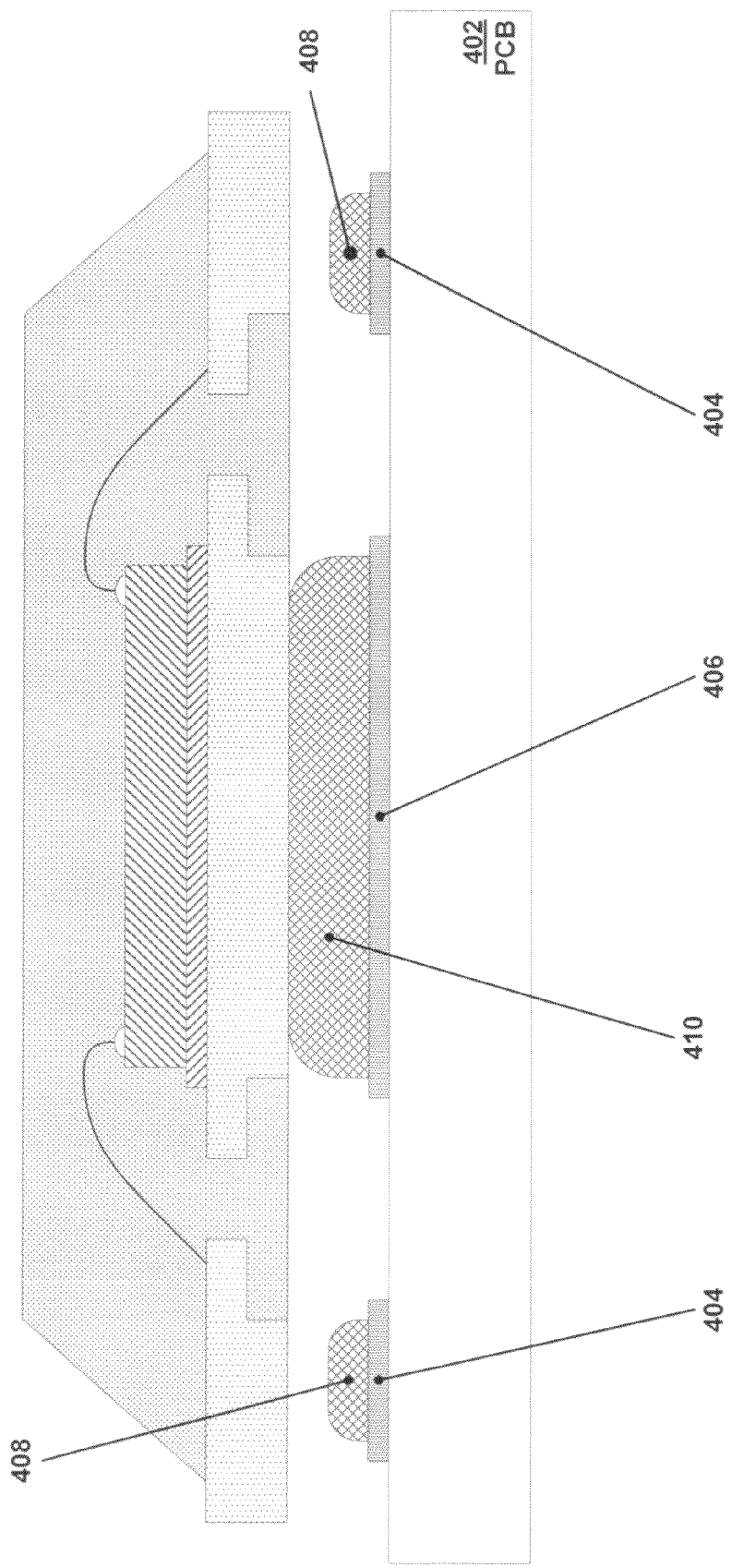
FIG. 4 illustrates a situation where too much solder is applied to the thermal land and pad of a conventional QFN leadframe.

FIG. 4 illustrates a situation where too much solder is applied to the thermal land and pad. PCB 402 is shown with exemplary thermal land 406 and I/O lands 404. A stencil is often used to mask the PCB exposing the metal lands. Solder paste is then applied to the metal lands on PCB 402. The solder paste applied to thermal land 406 is indicated by reference number 410 and the solder paste applied to I/O lands 404 is indicated by reference number 408. If the stencil aperture over the thermal land is much larger than the apertures over the individual I/O lands, too much solder can be applied to the thermal land leading to floating, a condition where the package is suspended above all or some of the I/O lands because of the excess solder, which can lead to open circuits ("opens"). In the alternative, the solder between of the thermal pad and thermal land is squeezed down so that all the I/O pads make electrical contact with the I/O lands. However, the excess solder between the thermal pad and thermal land must go somewhere. This can cause solder splattering and solder balling, which can lead to short circuits ("shorts").

It should be noted FIG. 4 is not typical in scale and that the amount of excess solder shown is an exaggeration in order to more clearly describe the problem of floating.

During the reflow process, the assembly comprising the package and the PCB are first heated to a predetermined temperature that allows the solvents in the solder paste to evaporate. In addition, the flux is activated. Then the assembly is heated to a higher temperature where the solder melts. During the heating process volatile gas is produced from the solder paste and flux flows. If the gases are not properly outgassed or the flux is not permitted to flow out, voids comprising either trapped gas or flux in the solder can form.

Figure 5:
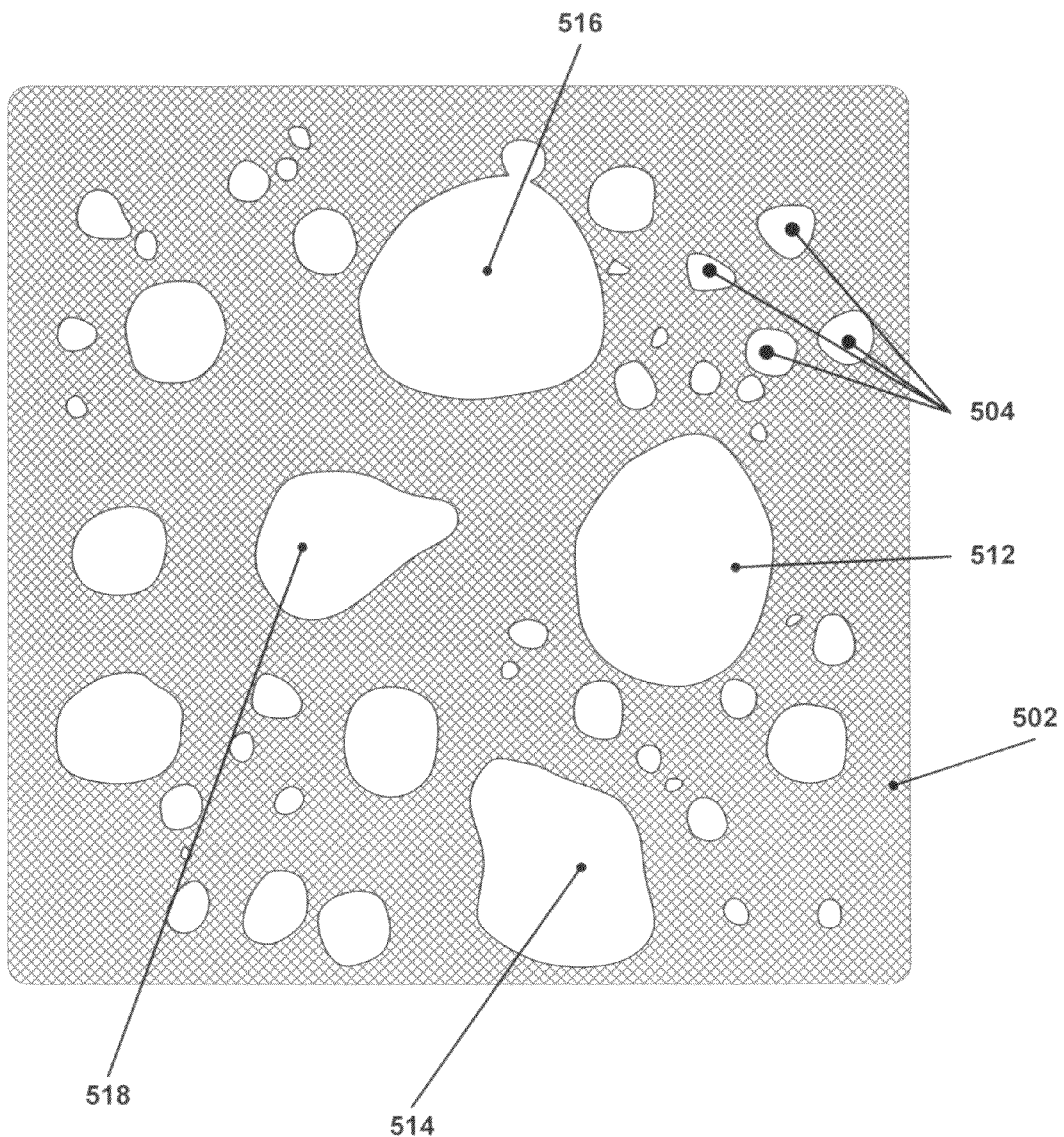
FIG. 5 shows a conventional solder layer between a thermal pad and thermal land.

FIG. 5 shows an exemplary solder layer between a thermal pad of package and a PCB thermal land. Solder 502 is the solder applied between a thermal pad and thermal land. While some amount of voiding is expected and accounted for, such as small voids 504. Large voids such as voids 512, 514, 516 and 518 can lead to hot spots in the fabricated die because insufficient heat is conducted from the region of the die above the void. In fact, trapped gas can even have a thermal insulative effect. These hotspots can potentially damage the fabricated die. While an overall void ratio of 30% can be acceptable, the size of individual voids should remain small to avoid hot spots.

Figure 6A:
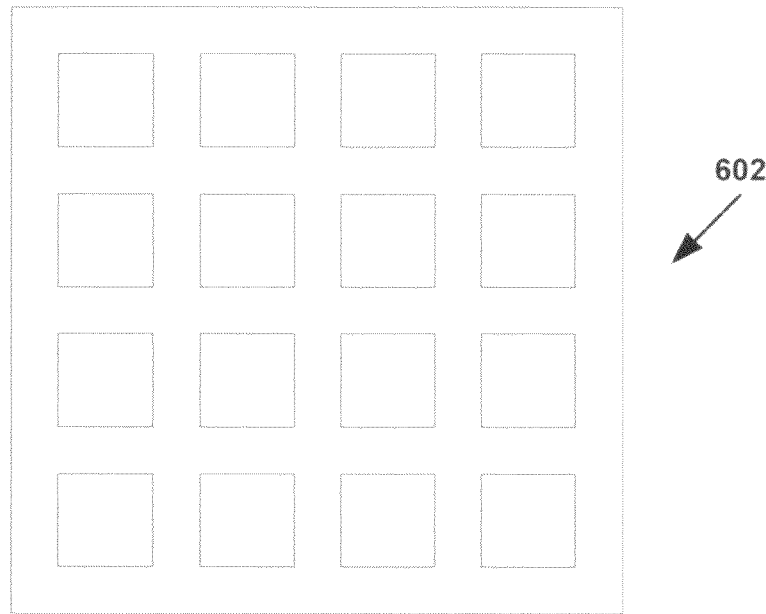
FIG. 6A shows a conventional thermal land.
Figure 6B:
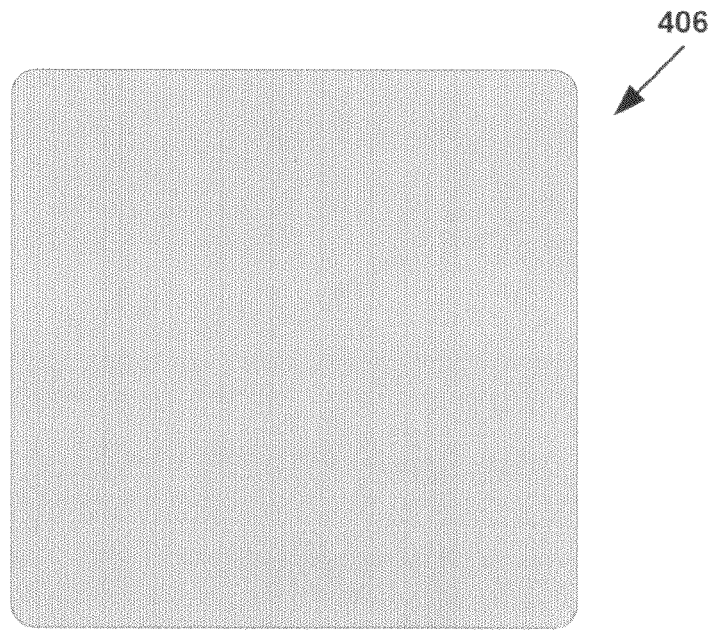
FIG. 6B shows a stencil matching the conventional thermal land of FIG. 6A.
Figure 7A:
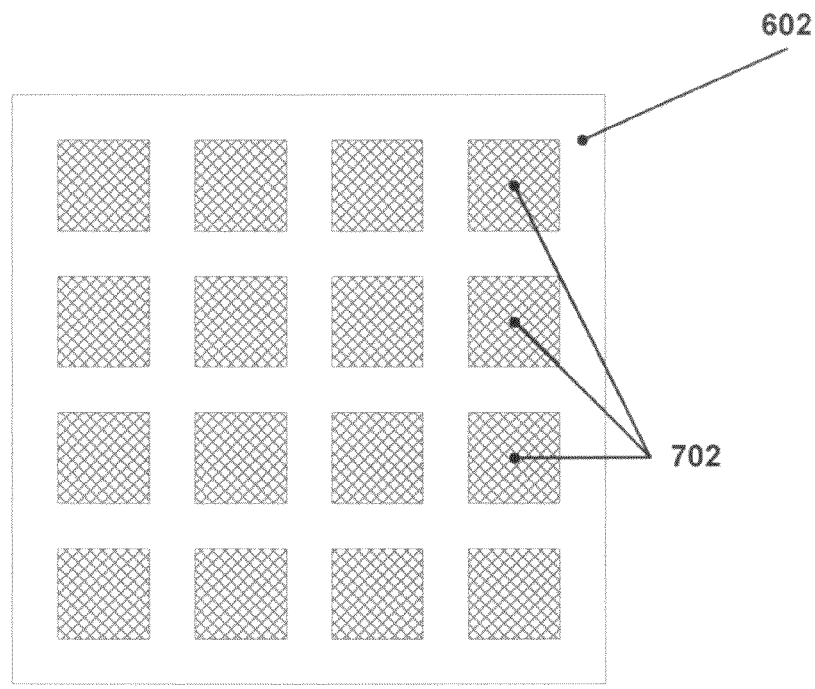
FIG. 7A shows a conventional stencil placed over a thermal land.
Figure 7B:
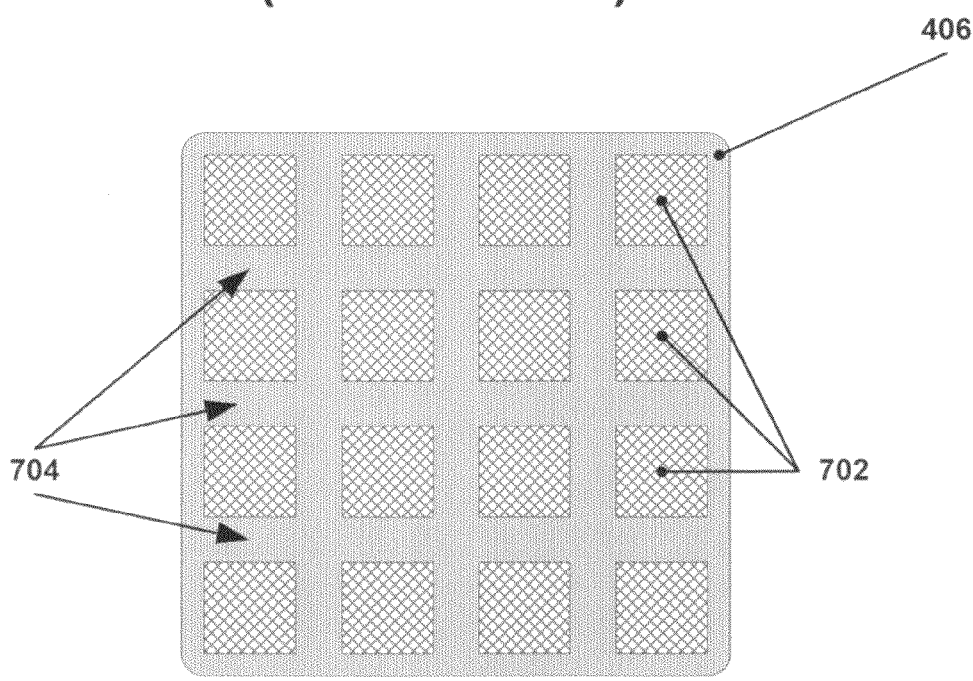
FIG. 7B shows solder on a conventional thermal land after the stencil is removed.

One solution is to use small apertures in the thermal land stencil. FIG. 6A shows PCB thermal land 406, and FIG. 6B shows matching stencil 602. Stencil 602 comprises a number of apertures for solder paste. FIG. 7A shows stencil 602 placed over thermal land 406. Solder paste 702 is then applied to thermal land 406 through the apertures in stencil 602. FIG. 7B shows thermal land 406 after stencil 602 is removed. Solder paste 702 is subdivided into a number of smaller portions. Gaps in the solder are indicated by reference arrow 704. These gaps permit gas and flux to escape during the reflow process, reducing voiding.

Figure 8:
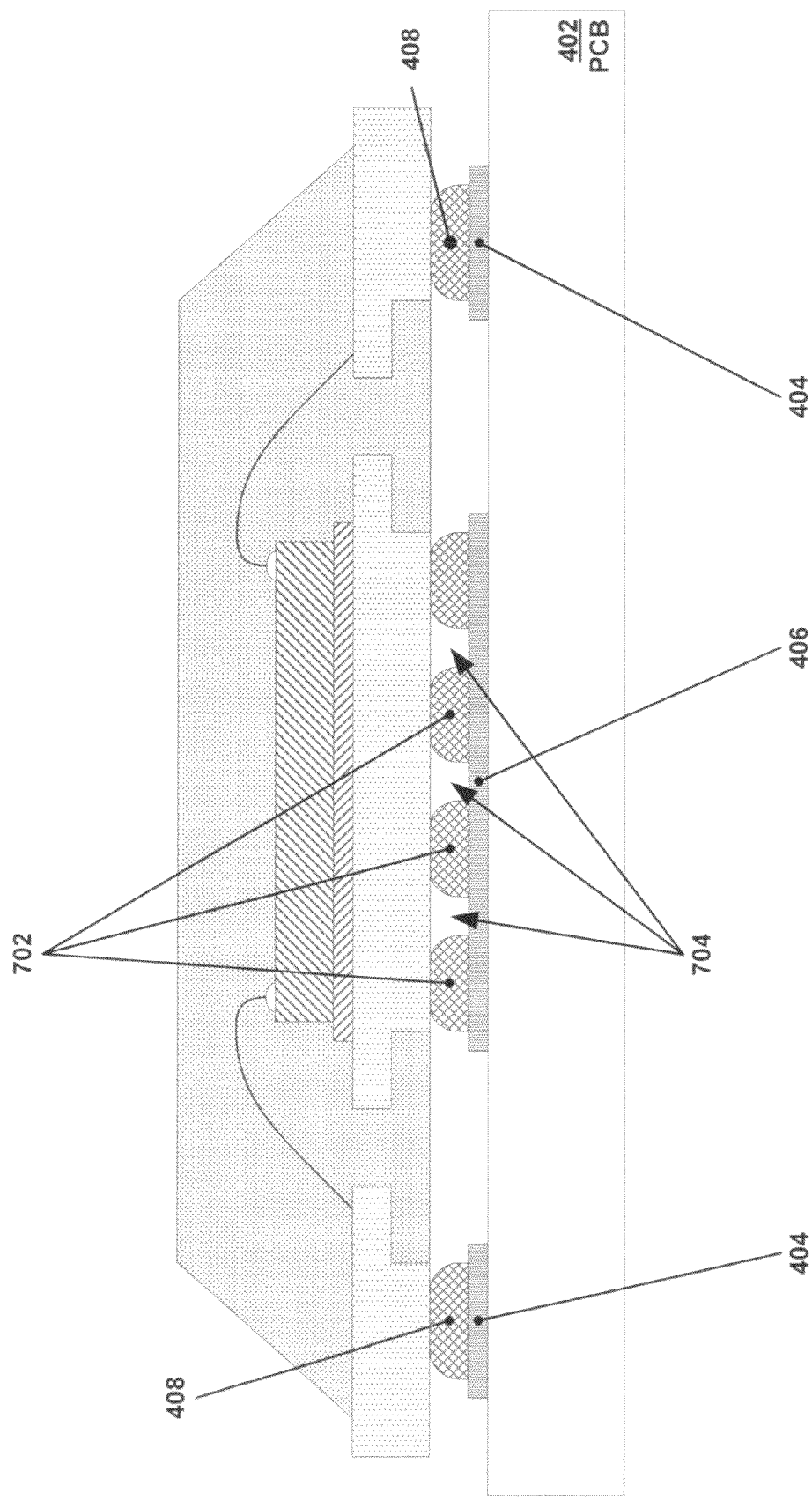
FIG. 8 is a side view of a conventional flat no-leads package placed on top of a PCB.

FIG. 8 is a side view of a flat no-leads package placed on top of a PCB. Because a stencil is used, solder paste indicated by 702 is more comparable in height to the solder paste applied to the I/O lands. Gaps shown by arrows 704 permit a controlled outgassing and permit flux to escape.

While the use of small aperture stencils can address the voiding problem, the type of stencil used is left to the end customer and even though small aperture stencils can be recommended by the manufacturer or packaging contractor, this recommendation is often ignored or not followed due to other process or design constraints (e.g. thermal via placement in PCB lands, etc).

Figure 9:
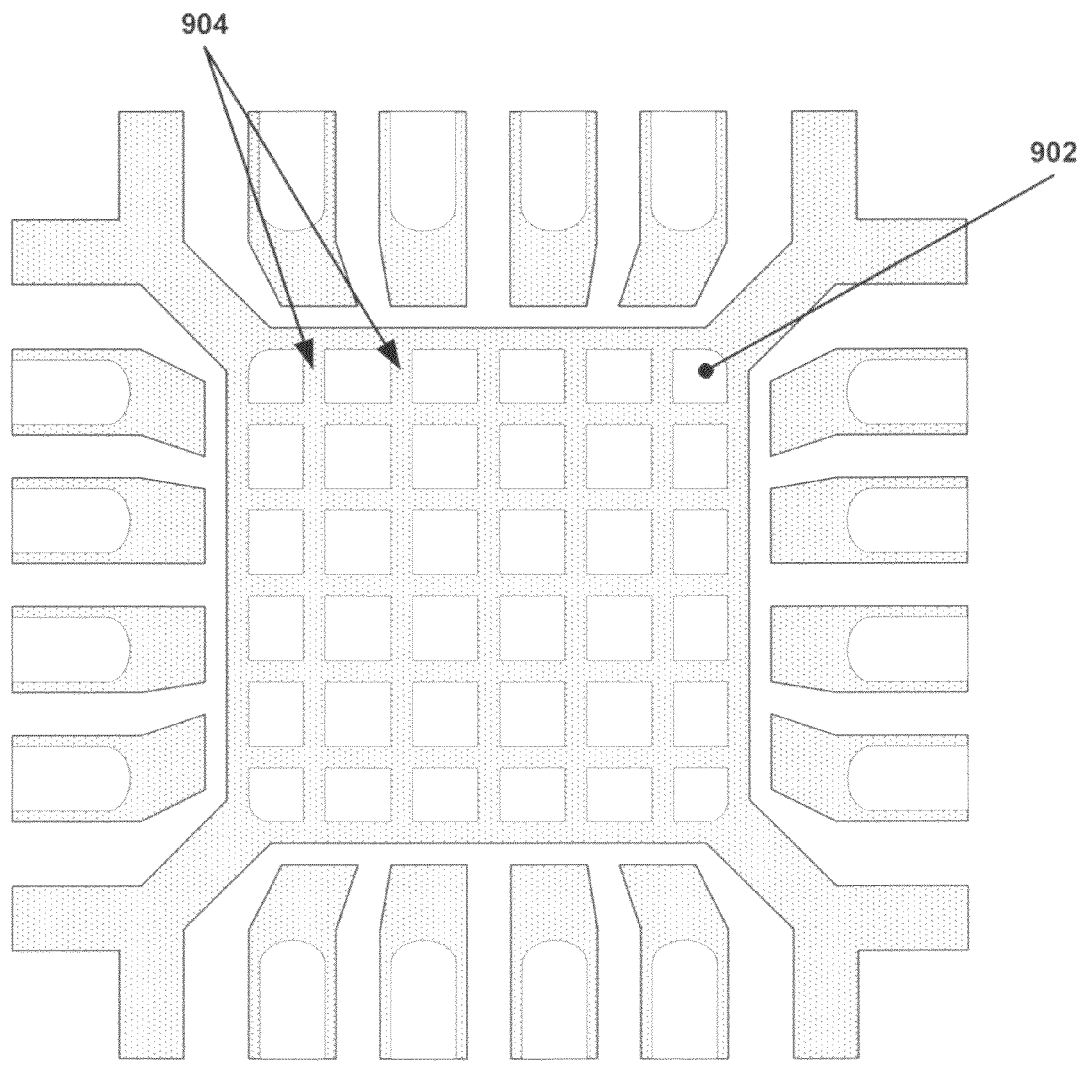
FIG. 9 shows the bottom view of an embodiment of a QFN leadframe, according to an embodiment of the present invention.

FIG. 9 shows the bottom view of an embodiment of a QFN leadframe, according to an embodiment of the present invention. The leadframe is similar to that shown in FIG. 3 except thermal pad 902 has channels 904 formed in the bottom surface of thermal pad 902, e.g. by etching, where the top surface of thermal pad 902 can be attached to a fabricated die. These channels are formed in a "city street" layout. Also, adjacent leadframes and tie bars are no longer shown for clarity. During a standard encapsulation process, mold compound would likely fill the channels. Regardless even if the mold compound completely fills the channels, the presence of the channels can facilitate a controlled outgassing and flux flow. When solder wets to the thermal pad, it effectively seals any escape route for the gas and the flux. Because, solder does not wet to the mold compound, the gas and flux can escape between the solder and the mold compound.

Figure 10:
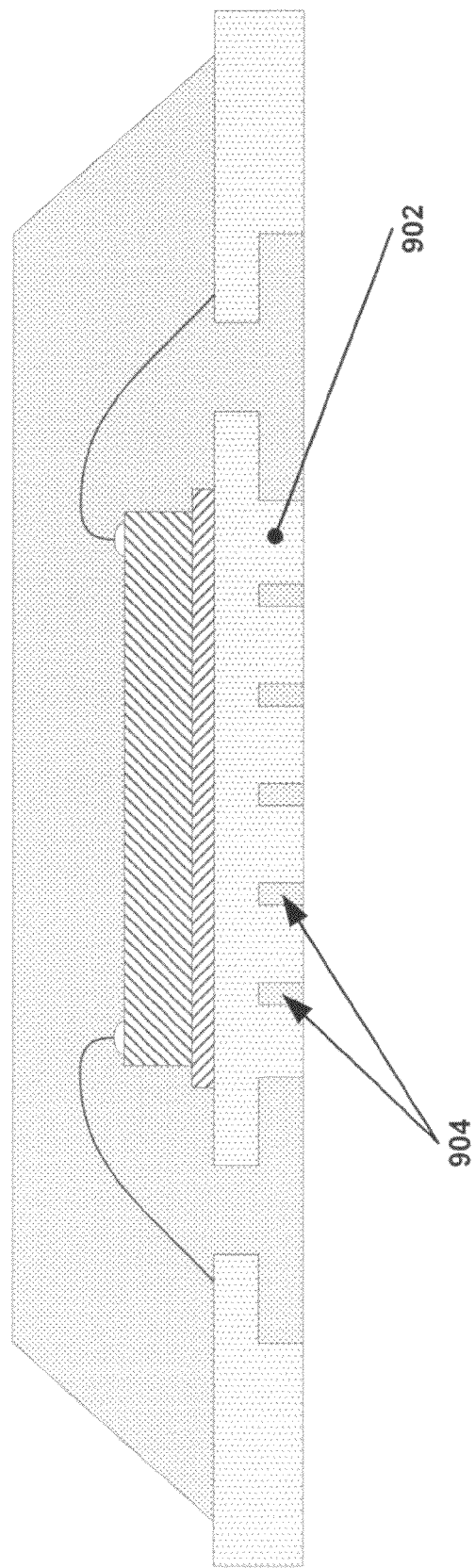
FIG. 10 shows a side view of an embodiment of a semiconductor package using the leadframe of FIG. 9.

FIG. 10 shows a side view of an embodiment of a semiconductor package using the leadframe described for FIG. 9. Once again Thermal land 902 has channels 904 formed in the bottom surface of thermal pad 902, e.g. by etching, to permit the escape of gases and flux, where the top surface of thermal pad 902 can be attached to a fabricated die. It should be noted that channels 904 are shown with the channels encapsulated in mold compound.

Figure 11:
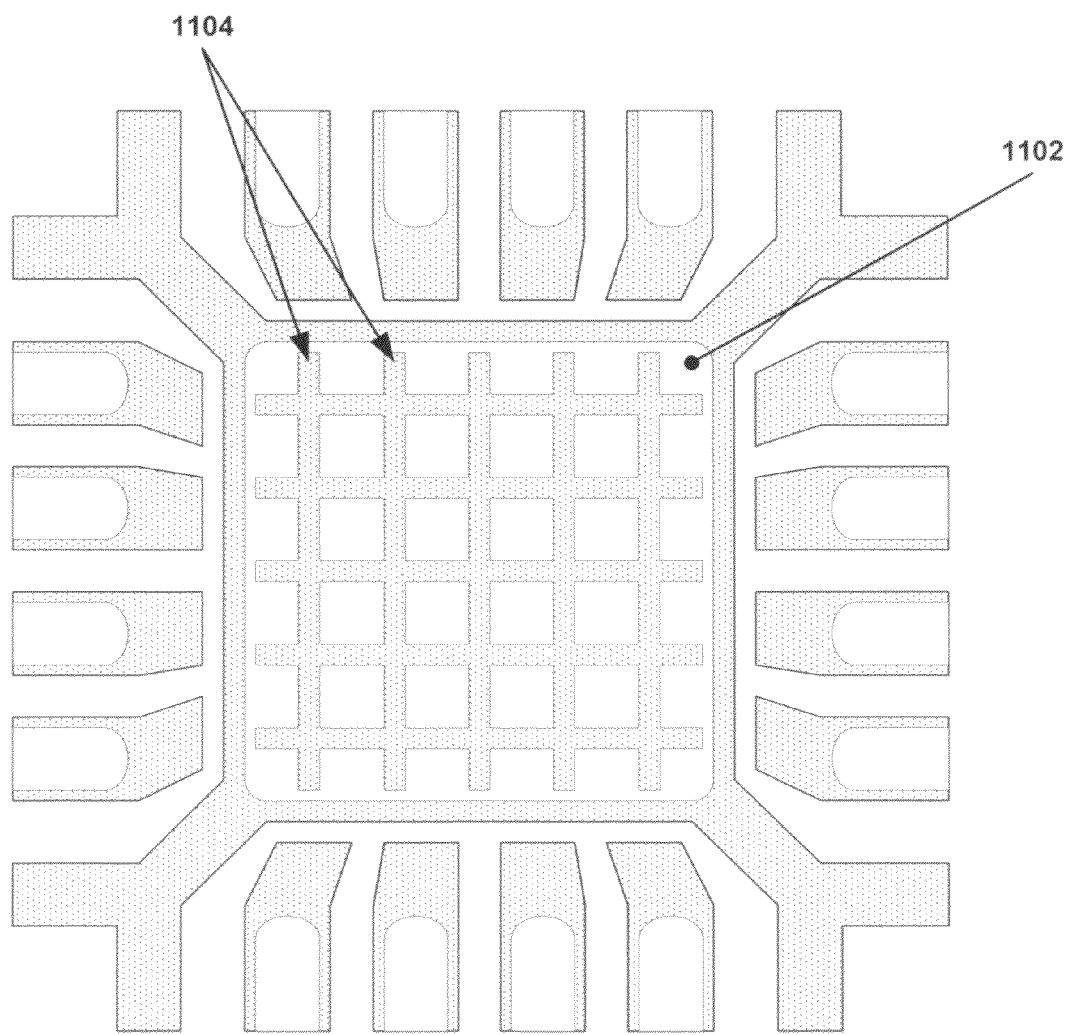
FIG. 11 shows the bottom view of another embodiment of a QFN leadframe, according to an embodiment of the present invention.

FIG. 11 shows the bottom view of another embodiment of a QFN leadframe, according to an embodiment of the present invention. It comprises thermal pad 1102 with channels 1104 formed in the bottom surface of thermal pad 902, e.g. by etching, where the top surface of thermal pad 1102 can be attached to a fabricated die. Unlike FIG. 9, channels 1104 do not extend all the way to the end of thermal pad 1102. By not leaving an opening at the end of thermal pad 1102 to the channels, mold compound can be easily kept out of the channels during the encapsulation process. In addition, because channels 1102 are empty, the cavity can accept excess solder to prevent floating. Furthermore, this increases the venting of gas during the reflow process.

Figure 12:
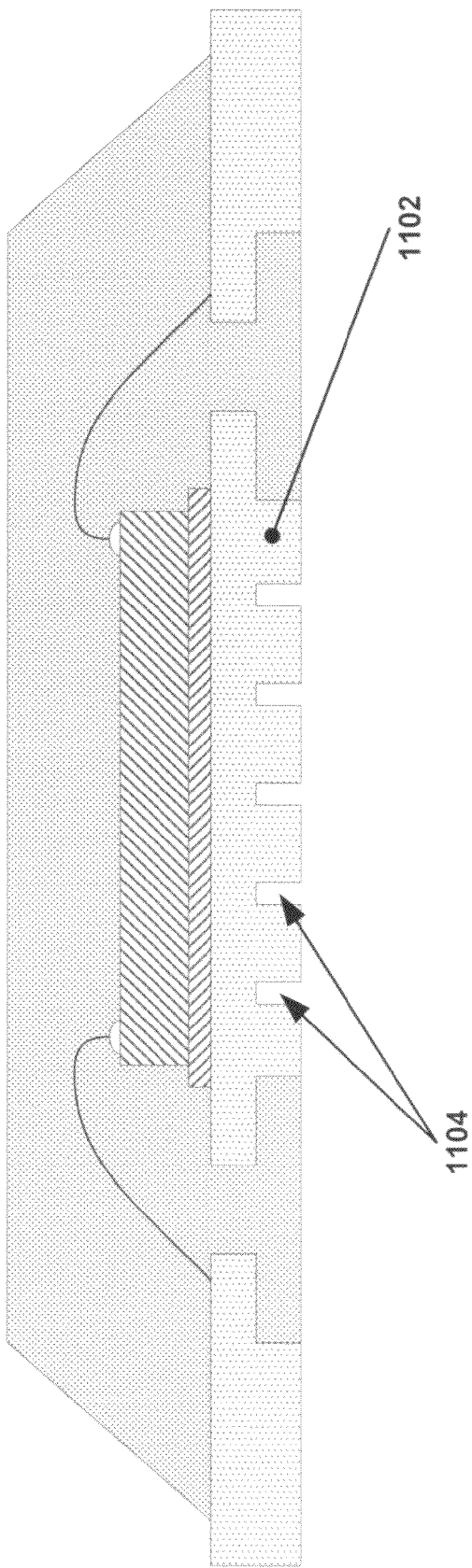
FIG. 12 shows a side view of an embodiment of a semiconductor package using the leadframe of FIG. 11.

FIG. 12 shows a side view of an embodiment of a semiconductor package using the leadframe described for FIG. 11. Thermal pad 1102 has channels 1104 formed in its bottom surface, e.g. by etching, to permit the escape of gases and flux, where the top surface of thermal pad 1102 can be attached to a fabricated die. It should be noted that channels 1104 are not encapsulated in mold compound.

Figure 13:
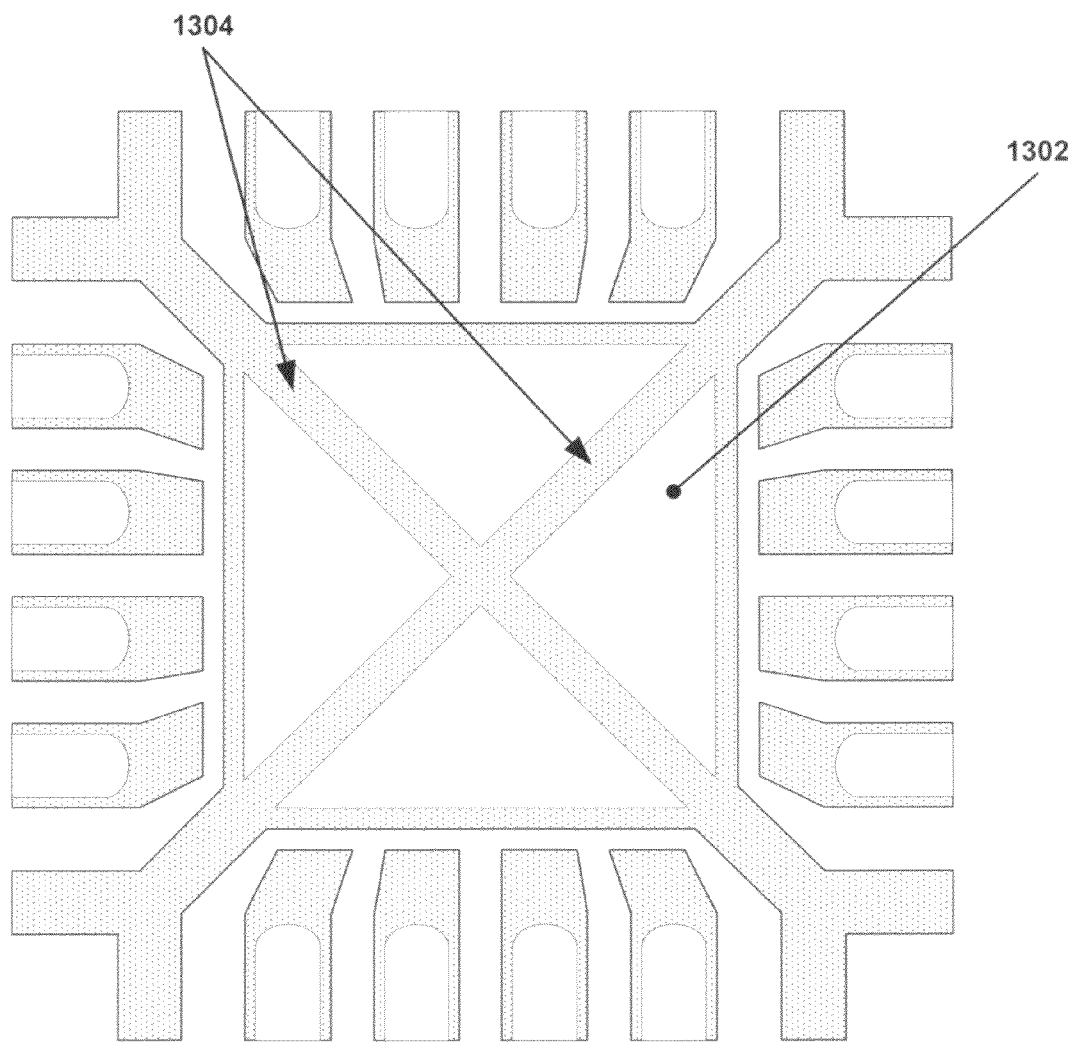
FIG. 13 shows the bottom view of another embodiment of a QFN leadframe, according to an embodiment of the present invention.
Figure 14:
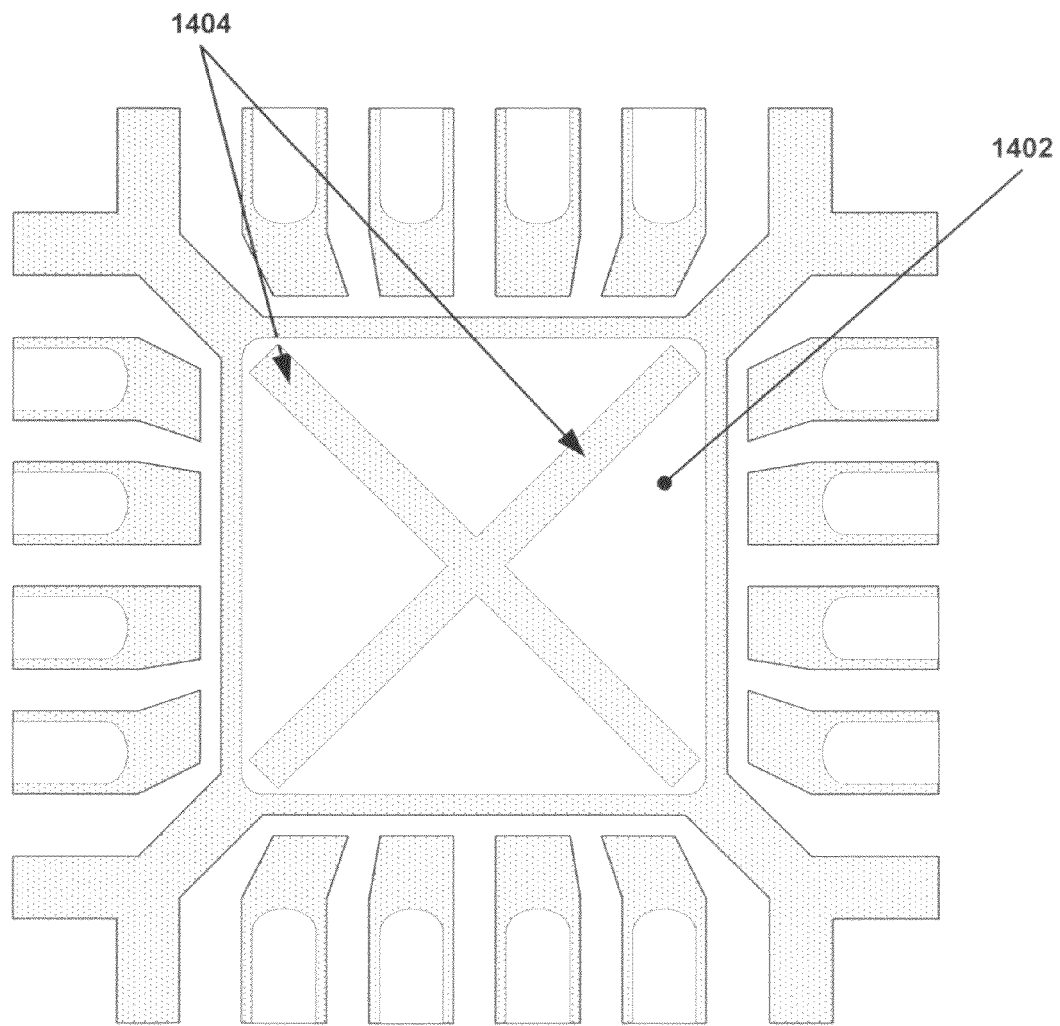
FIG. 14 shows the bottom view of another embodiment of a QFN leadframe, according to an embodiment of the present invention.

FIG. 13 shows the bottom view of another embodiment of a QFN leadframe, according to an embodiment of the present invention. The leadframe comprises thermal pad 1302, which has channels 1304 formed in its bottom surface, e.g. by etching. Compared to the leadframe in FIG. 9, channels 1304 form a simpler pattern. This pattern resembles an "X" pattern. FIG. 14 shows the bottom view of another embodiment of a QFN leadframe. The leadframe is similar to that in FIG. 13 except channels 1404 formed in thermal pad 1402 do not extend all the way to the end of thermal pad 1402.

Figure 15:
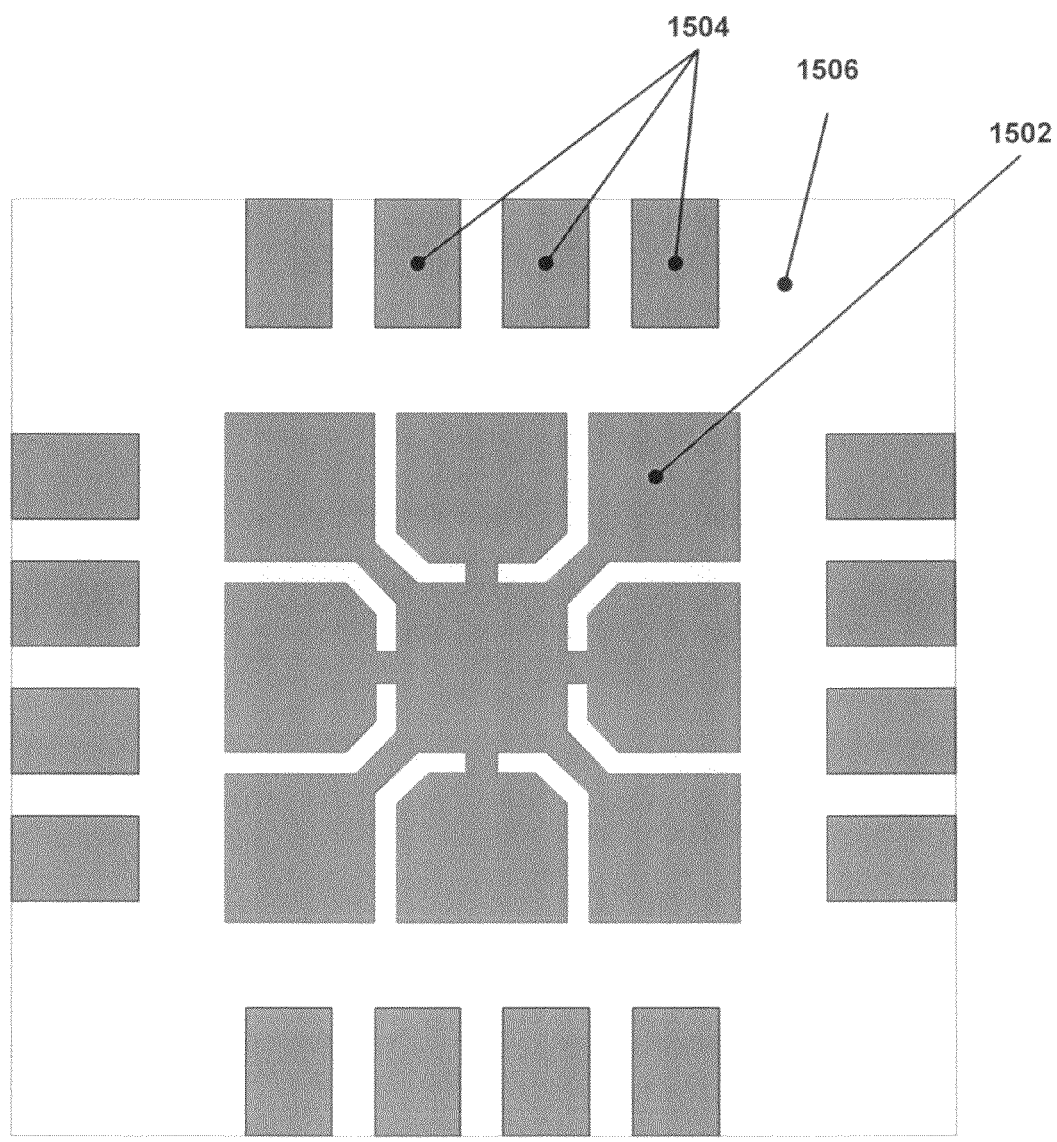
FIG. 15 shows an exemplary land for a high speed application, according to an embodiment of the present invention.

Countless patterns can be etched onto a thermal pad to provide escape channels. These patterns can be adopted from patterns used for other purposes. For example, special patterns are often used in PCBs for high speed applications. FIG. 15 shows an exemplary land for a high speed application. PCB 1506 comprises several I/O pads 1504 and thermal land 1502. Thermal land 1502 is formed into the patterns shown in the figure for high speed applications. The pattern used for thermal land 1502 can also be etched into the thermal pad of a flat no-leads package.

Figure 16:
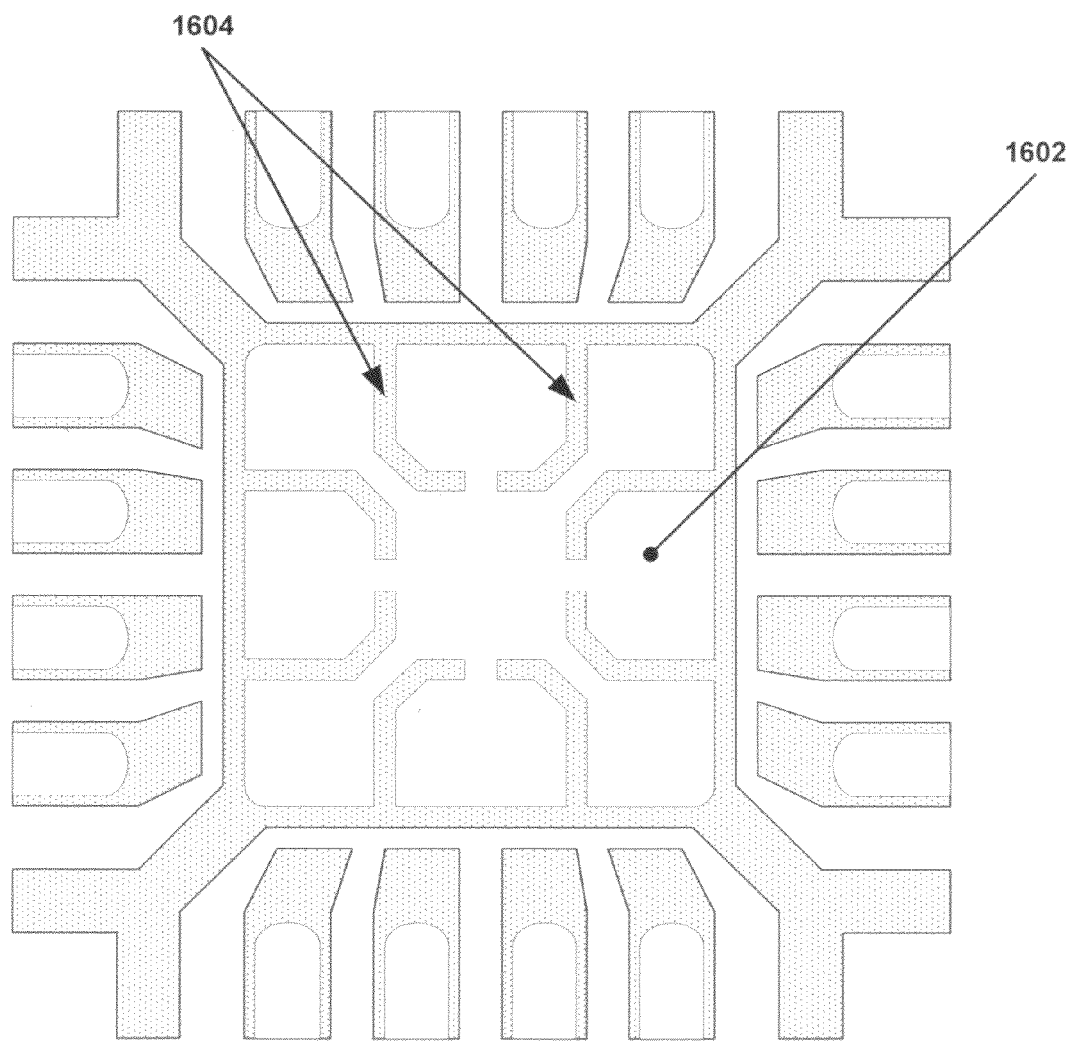
FIG. 16 shows the bottom view of another embodiment of a QFN leadframe, according to an embodiment of the present invention.

FIG. 16 shows the bottom view of another embodiment of a QFN leadframe, according to an embodiment of the present invention. This leadframe comprises thermal pad 1602, which is formed into a pattern matching thermal land 1502 on PCB 1506. This pattern leaves channels 1604 for outgassing, and flux flow.

Figure 17:
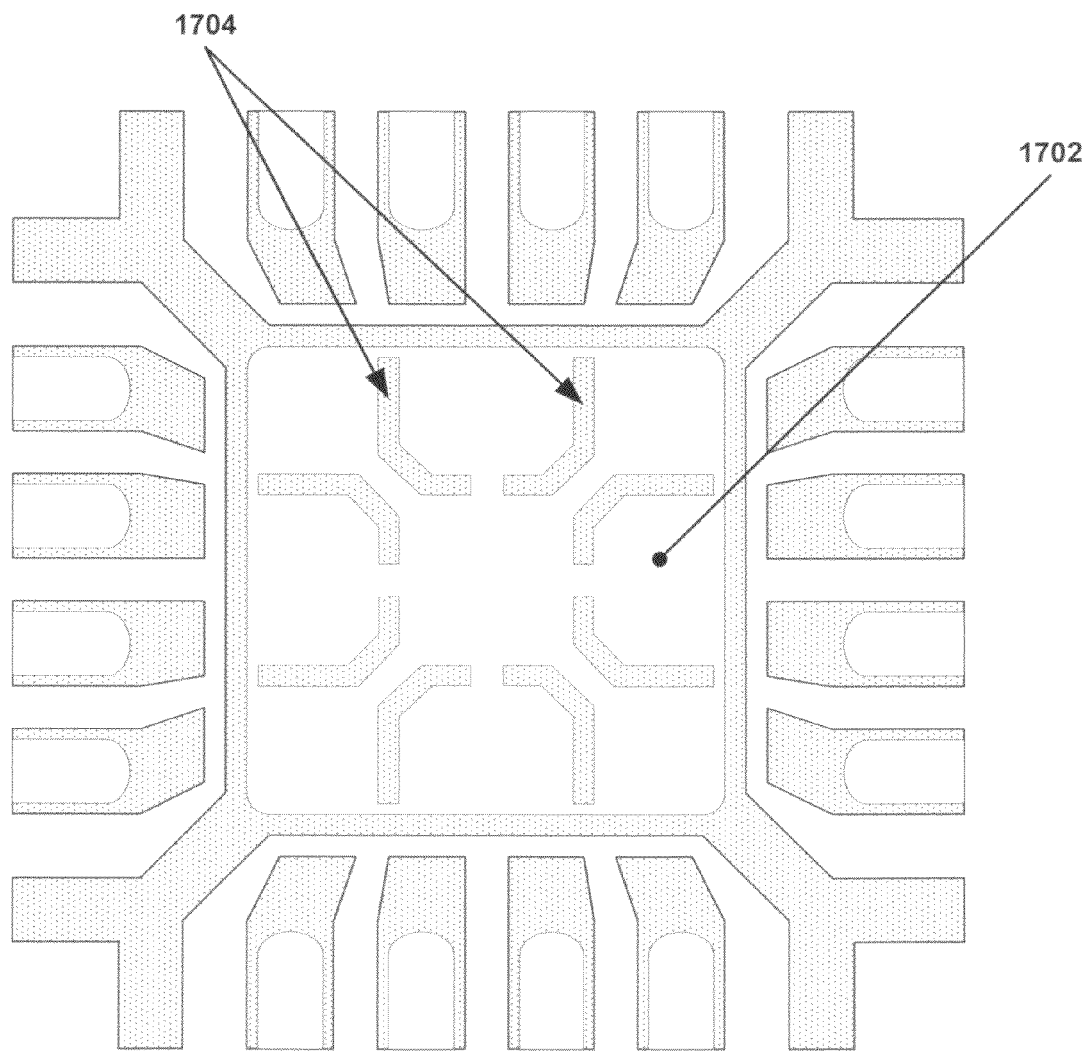
FIG. 17 shows the bottom view of yet another embodiment of a QFN leadframe, according to an embodiment of the present invention.

FIG. 17 shows the bottom view of yet another embodiment of a QFN leadframe, according to an embodiment of the present invention. This leadframe is similar to the leadframe shown in FIG. 16 except that the pattern formed in thermal pad 1702 does not extend to the edge of thermal pad 1702. This pattern leaves channels 1704 for outgassing, flux flow and excess solder relief FIG. 18 shows a flow chart of a manufacturing technique for a leadframe, according to an embodiment of the present invention. At step 1802, a photoresist mask is applied to the both surface of a strip of metal. In greater detail, the process of applying the photoresist mask begins by applying a photoresist material to both surfaces of a strip of metal. Then a glass patterned masks are applied to both surfaces of the strip of metal where the glass mask applied to the top surface is patterned with the basic leadframe pattern such as the metal pattern shown in FIG. 2 and the glass mask applied to the bottom surface is patterned with the half-etch pattern such as that shown in FIG. 3. The photoresist material is exposed to ultraviolet light. The glass patterned masks are then removed. The photoresist material is then developed leaving photoresist material only where etching is not desired. At step 1804, the sheet is fully etched. At step 1806, the sheet is half-etched. After the etching any remaining photoresist material can be removed. At step 1810, the leadframe is often plated with nickel/palladium/gold or silver for selective areas to facilitate wire bonding. Alternatively, the metal strip may already be pre-plated in which case step 1810 can be omitted.

In one embodiment, the etch pattern in step 1802 may also include the thermal pad pattern, so that the thermal pad can be patterned as part of step 1806 for forming channels at the bottom of the thermal pad. However, alternatively, at step 1808, a separate photoresist and etching step can be employed to pattern the thermal pads in one of the patterns described above. The step of applying the photoresist mask is similar to that described above for steps 1802 and 1804 or 1806.

Once fabricated, the leadframe sheet is produced, a package can be created as shown in FIG. 19, according to an embodiment of the present invention. At step 1902, a semiconductor die is attached with die attach material, typically an epoxy, to the top surface of the thermal pad of the leadframe. In fact a plurality of semi conductor dies are attached to their respective locations on the top surface of the thermal pad of the leadframe sheet. At step 1904, each semiconductor die is wire bonded to the bond pads on the semiconductor die and the I/O pads of the leadframe. At step 1906, each package is encapsulated in mold compound. At step 1908, the array of packages is singulated into their individual packages.

In one embodiment of the present application, a flat no-leads package with superior anti-voiding properties comprises a metal leadframe having an I/O pad and a thermal pad, a fabricated semiconductor die with bond pads and wire bonds connecting each bond pad to an I/O pad on the leadframe. The thermal pads have a pattern of channels formed therein. The package may then be covered by mold compound. In some embodiments, the channels are completely free of mold compound, in others, the channels are completely filled with mold compound and in still others the channels are partially filled. The pattern of channels can take on many forms, several examples include an "X" pattern, a city street pattern and a high speed printed circuit board thermal land design. In some embodiments, the channels extend to the border of the thermal land; in others, the channels do not extend to the border. The channels are typically half-etched into the thermal land.

Package types include, but are not limited to, micro leadframe package quad (MLPQ), micro leadframe package micro (MLPM), micro leadframe package dual (MLPD), dual row micro leadframe (DRMLF), dual flat no-lead package (DFN), thin dual flat no-lead package (TDFN), ultra thin dual flat no-lead package (UTDFN), extreme thin dual flat no-lead package (XDFN), quad flat no-lead package with top exposed pad (QFN-TEP), thin quad flat no-lead package (TQFN), quad flat no lead package (VQFN, WQFN, UQFN, XQFN depending on the thickness of package), LLP (Leadless leadframe package), LPCC (leadless plastic chip carrier), small outline no lead (SON), and leadframe chip scale package (LFCSP).

A corresponding method of fabricating the semiconductor package with superior anti-voiding properties, according to the above example embodiment, may comprise applying a first photoresist material to the top surface of a metal lead frame, applying a second photoresist material to the bottom surface of the metal leadframe, fully etching the metal leadframe on the basis of a pattern defined by the first photoresist material, and partially etching the metal leadframe from the bottom surface on the basis of the pattern of the second photoresist material. In one embodiment, the second photoresist material is patterned with channels in the thermal pad. In another embodiment, a third photoresist material is patterned with channels in the thermal pad and applied to the bottom surface after the partial etching step. The bottom surface is then partially etched according to the third photoresist material. Optionally, the fabrication method can also comprise plating metal on the top surface and the bottom surface of the metal leadframe. The partial etching can be an etching to half the thickness of the metal leadframe.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A semiconductor package for attaching to a thermal land of a printed circuit board, the semiconductor package comprising:
   a leadframe having an I/O pad and a thermal pad;
   a fabricated semiconductor die having a bond pad, said fabricated semiconductor die attached to a top surface of the thermal pad;
   a wire bond connecting the bond pad to the I/O pad;
   wherein a bottom surface of the thermal pad comprises a channel pattern matching a channel pattern of the thermal land, wherein the thermal land is attached to the bottom surface of the thermal pad so as to create channels with upper walls defined by the thermal pad and lower walls defined by the thermal land.

2. The package of claim 1 wherein the channels are partially filled with a mold compound.

3. The package of claim 1 wherein the channels are completely filled with a mold compound.

4. The package of claim 1 wherein the channels contain no mold compound.

5. The package of claim 1 wherein the channels form a pattern resembling "X".

6. The package of claim 1 wherein the channels form a grid pattern.

7. The package of claim 1 wherein the channels extend to the border of the thermal pad.

8. The package of claim 1 wherein the channels do not extend to the border of the thermal pad.

9. The package of claim 1 wherein the channels are half etched into the thermal pad.

10. The package of claim 1 wherein the package is a quad flat no-lead package, a micro leadframe package quad, a micro leadframe package micro, a micro leadframe package dual, a dual row micro leadframe package, a dual flat no-lead package, a thin dual flat no-lead package, a ultra thin dual flat no-lead package, a extreme thin dual flat no-lead package, a quad flat no-lead package with top exposed pad, or a thin quad flat no-lead package.

11. A method of fabricating a leadframe having a thermal pad and an I/O pad, the leadframe having a top surface and a bottom surface for coupling to a thermal land of a printed circuit board, the method comprising:
    applying a first photoresist material to the top surface of the leadframe;
    applying a second photoresist material to the bottom surface of the leadframe, the second photoresist material having a pattern defining channels in a bottom surface of the thermal pad, wherein the pattern defining channels matches a channel pattern of the thermal land attached to the bottom surface of the thermal pad so as to create channels with upper walls defined by the thermal pad and lower walls defined by the thermal land;
    etching the leadframe on the basis of a pattern defined by the first photoresist material; and
    etching the leadframe from the bottom surface on the basis of the pattern of the second photoresist material to form the channels in the bottom surface of the thermal pad.

12. The method of claim 11 further comprising:
    plating on the top surface and the bottom surface of the leadframe.

13. The method of claim 11 wherein the etching of the leadframe from the bottom surface etches half the thickness of the leadframe.

14. The method of claim 11 wherein the channels form a pattern resembling "X" or a grid pattern.

15. A method of packaging a semiconductor die having a bond pad, the method comprising:
    providing a leadframe having a thermal pad and an I/O pad;
    forming a channel pattern in a bottom surface of the thermal pad matching a channel pattern of a thermal land of a printed circuit board attached to the bottom surface of the thermal pad so as to create channels with upper walls defined by the thermal pad and lower walls defined by the thermal land;
    attaching the semiconductor die to a top surface of the thermal pad;
    wire bonding the bond pad to the I/O pad; and
    singulating a package having the semiconductor die, the wire bond and the leadframe.

16. The method of claim 15 wherein the channels form a pattern resembling "X" or a grid pattern.

17. The method of claim 15 wherein the channels extend to the border of the thermal pad.

18. The method of claim 15 wherein the channels do not extend to the border of the thermal pad.

19. The method of claim 15 wherein the channels are half etched into the thermal pad.

* * * * *